United States Patent
Chen et al.

(10) Patent No.: US 10,468,265 B1
(45) Date of Patent: Nov. 5, 2019

(54) METHOD FOR SYNCHRONOUS WET ETCHING PROCESSING OF DIFFERENTIAL MICROSTRUCTURES

(71) Applicant: Guangdong University of Technology, Guangzhou, Guangdong (CN)

(72) Inventors: Xin Chen, Guangdong (CN); Yun Chen, Guangdong (CN); Dachuang Shi, Guangdong (CN); Xun Chen, Guangdong (CN); Qiang Liu, Guangdong (CN); Jian Gao, Guangdong (CN); Chengqiang Cui, Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 16/383,885

(22) Filed: Apr. 15, 2019

(30) Foreign Application Priority Data

Apr. 16, 2018 (CN) .......................... 2018 1 0338811

(51) Int. Cl.
| | |
|---|---|
| *H01L 31/0216* | (2014.01) |
| *B81C 1/00* | (2006.01) |
| *H01L 21/308* | (2006.01) |
| *H01L 21/306* | (2006.01) |

(52) U.S. Cl.
CPC .... *H01L 21/3085* (2013.01); *H01L 21/30604* (2013.01)

(58) Field of Classification Search
CPC .......... H01L 21/31111; H01L 21/0273; H01L 21/0274; H01L 21/30604; H01L 21/3213; H01L 21/465; H01L 31/0508; H01L 27/1214; H01L 27/016; H01L 27/10844; H01L 27/1288; H01L 27/3276; H01L 2924/0002; B81C 1/00111
See application file for complete search history.

(56) References Cited

U.S. PATENT DOCUMENTS

| | | | |
|---|---|---|---|
| 6,703,291 B1 | 3/2004 | Boyanov et al. | |
| 2003/0186074 A1 | 10/2003 | Chen | |
| 2008/0268164 A1* | 10/2008 | Thayer | ...................... C23C 8/04 427/446 |
| 2018/0149985 A1* | 5/2018 | Liu | ...................... G03F 7/70875 |
| 2019/0171106 A1* | 6/2019 | Fu | .......................... G03F 7/2004 |

FOREIGN PATENT DOCUMENTS

| | | |
|---|---|---|
| CN | 101037185 A | 9/2007 |
| CN | 202434478 U | 9/2012 |

* cited by examiner

*Primary Examiner* — Caridad Everhart
(74) *Attorney, Agent, or Firm* — Wayne & Ken, LLC; Tony Hom

(57) ABSTRACT

A method for synchronous wet etching processing of differential microstructures, including the following steps: step a: performing photoetching on a processing surface of a workpiece to be processed to develop the workpiece; step b: affixing a mask to a surface opposite to the processing surface of the workpiece; step c: continuously cooling the mask; step d: placing the cooled mask and the workpiece in a wet etching device; and adding an etchant to the processing surface of the workpiece to start etching; step e: removing the mask and the workpiece from the wet etching device after the set etching time; separating the mask and the workpiece to obtain a workpiece with a etching structure. A temperature difference is formed between the pattern area to be processed and the retaining area.

8 Claims, 2 Drawing Sheets

METHOD FOR SYNCHRONOUS WET ETCHING PROCESSING OF DIFFERENTIAL MICROSTRUCTURES

CROSS-REFERENCE TO RELATED APPLICATIONS

This application claims the benefit of priority from Chinese Patent Application No. CN201810338811.0, filed on Apr. 16, 2018. The content of the aforementioned application, including any intervening amendments thereto, is incorporated herein by reference in its entirety.

TECHNICAL FIELD

The present disclosure relates to micro-nano manufacturing, and more particularly to a method for synchronous wet etching processing of differential microstructures.

BACKGROUND OF THE INVENTION

Wet etching is a processing means commonly used in the micro-nano processing. Chemical reagents are adopted in the wet etching to etch or dissolve the material to be processed so as to remove the materials. The wet etching rate is associated with the reaction type and is also highly susceptible to the reaction temperature. The wet etching can be performed in the case where a reagent capable of etching and dissolving the material to be processed is available. Therefore, the method has been widely applied in the processing of micro-nano structures, fabrication of printed circuit boards, display devices and integrated circuits.

However, certain limitations still exist in the wet etching. For example, when a single crystal silicon is etched by a typical TMAH solution or KOH solution, the etching direction of <100> is presented as 54.7° on the surface of the workpiece, making it difficult to obtain the smooth vertical vias or grooves. In addition, micro vias and grooves with different sizes cannot be processed on the same workpiece. Therefore, it is urgent to propose a method for synchronous wet etching processing of differential microstructures to extend the application range of the wet etching processing.

SUMMARY OF THE INVENTION

In order to overcome the defects of the prior art, the present application provides a method to achieve wet etching of micro vias and grooves with different sizes in a wet etching process by selectively controlling temperatures at different areas on a workpiece to be processed through a mask.

A method for synchronous wet etching processing of differential microstructures, including the following steps:

step a: performing photoetching on a processing surface of a workpiece to be processed to develop the workpiece; wherein a pattern area to be processed on the processing surface of the workpiece is exposed, and a pattern area without processing is covered by a photoresist layer;

step b: affixing a mask to a surface of the workpiece opposite to the processing surface; wherein a processing pattern on the mask has the same shape as and aligns with the pattern area to be processed on the processing surface;

step c: continuously cooling the mask affixed to the surface of the workpiece to be processed;

step d: placing the cooled mask and the workpiece in a wet etching device; and adding an etchant to the processing surface of the workpiece to start etching;

step e: setting an etching time; removing the mask and the workpiece from the wet etching device after the set etching time; stopping the etching; separating the mask and the workpiece to obtain a workpiece with an etching structure.

In step a, the workpiece to be processed is a wafer made of silicon. The method for synchronous wet etching processing of differential microstructures is usually applied to products in the semiconductor industry, for example, silicon as a most commonly used semiconductor material in the industry; particularly, wafer made of silicon semiconductor material. Due to the material properties of silicon, the processing method has a higher processing accuracy.

In some embodiments, the photoresist layer in step a is 10 nm-10 µm in thickness. If the thickness of the photoresist layer is too thick, the pattern area to be processed on the processing surface of the workpiece cannot be exposed fast and completely after development; and if the thickness of the photoresist layer is too thin, the pattern area without processing on the surface is easily exposed, which significantly affects the processing effect of the subsequent wet etching process. Only the thickness of the photoresist layer is limited to a certain range, it can meet the fast photoetching and developing operations of different workpieces to be processed, and can ensure the processing precision of the final product.

In some embodiments, the mask in step b includes a light shielding layer and a base layer. The base layer is made of stainless steel or copper which are not easily etched and have good thermal conductivity. The mask made up of these two layers has a low cost, a good thermal conductivity and can stably shield the pattern on the back surface of the workpiece, that is, a surface opposite to the processing surface. At the same time, the heat can be conducted faster, allowing for a processing temperature difference at different pattern areas in the wet etching process of the workpiece.

In some embodiments, in step c and/or step d, the mask is continuously cooled by flowing liquid nitrogen. On the one hand, the liquid nitrogen does not react with the mask made of stainless steel or copper such that the mask is not etched; and on the other hand, the liquid nitrogen is a fast-cooling and harmless coolant so as to maintain the processing temperature difference of different pattern areas of the workpiece to be processed in the wet etching process.

In some embodiments, the etchant in step d is a TMAH etching solution or a KOH etching solution.

In some embodiments, the etching time in step e is set as 5 min to 5 h. The thickness of the initial wafer is 450-500 µm, and the thickness of the finished chip is about 150-200 µm. The etching rate of the processing method in the present application is generally 0.5 µm/min. The structure depth to be etched is usually about 2.5-150 µm. If the etching time is less than the set value, the structure depth etched is insufficient. If the etching time exceeds the set value, the structure depth etched is too deep. Thus, the etching time is refined to minimize the inferior products.

In some embodiments, in step e, a depth-to-width ratio of micro vias or grooves in the etching structure is greater than 5.

For a structure with micro vias or grooves with a depth-to-width ratio of greater than 5, the method of the present invention has an excellent processing effect over the conventional wet etching processing method. Firstly, the processing surface of the workpiece, i.e., the front surface, is photoetched and developed to expose the material in the pattern area to be processed. At the same time, the mask with the same pattern is affixed on a surface opposite to the processing surface, i.e., the back surface of the workpiece to be processed. The mask is cooled by a flowing liquid nitrogen.

Then, the workpiece to be processed is placed in a wet etching device together with the mask. Then the etchant is added to start etching. During the etching process, the mask is continuously cooled by liquid nitrogen. Therefore, the temperature of the local area of the workpiece to be processed which is in direct contact with the pattern on the mask is also lowered. The temperature of the other areas which are not in direct contact with the pattern on the mask is maintained at a higher state, that is, a high temperature area which is the same as the pattern area to be processed is formed on the workpiece to be processed. Therefore, on the workpiece to be processed, a temperature difference is formed between the pattern area to be processed and the area to be retained. In the pattern area to be processed, the temperature is higher and the etching rate is faster; however, in the retaining area, the temperature is lower and the etching rate is slower. The difference in etching rate is created by creating a temperature difference on the workpiece, so that micro vias and grooves can be processed with a higher depth-to-width ratio.

in which: 401, etchant; 402, photoresist layer; 403, workpiece; 404, light shielding layer; 405, base layer; 406, liquid nitrogen; and 407, finished vias or grooves.

DETAILED DESCRIPTION OF EMBODIMENTS

The present invention will be further described below with reference to the accompanying drawings and embodiments.

Figure 1:
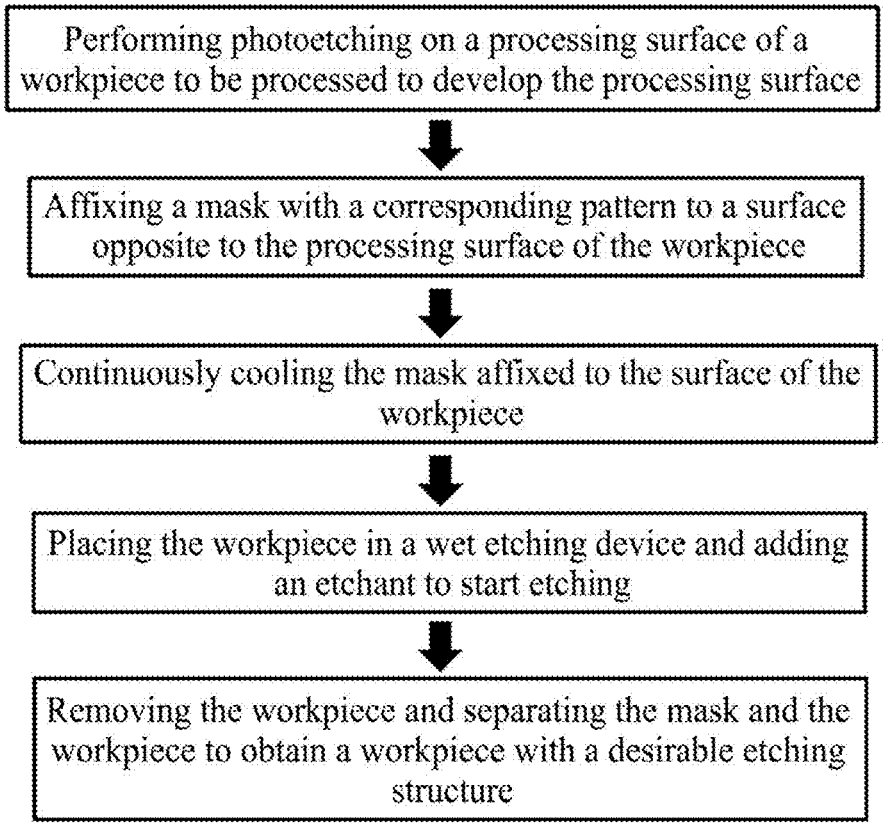
FIG. 1 is a flow diagram according to an embodiment of the present invention.
Figure 2:
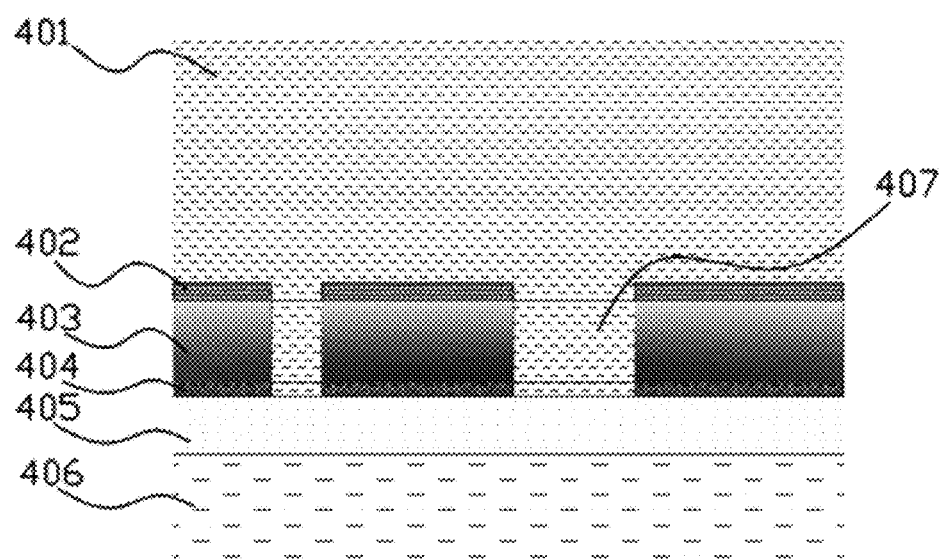
FIG. 2 is a schematic diagram showing a structure after the wet etching is complete according to an embodiment of the present invention.

As shown in FIGS. 1 and 2, a method for synchronous wet etching processing of differential microstructures includes the following steps.

Step a: A photoetching is performed on a processing surface of a workpiece 403 to be processed to develop the processing surface of the workpiece 403 where a pattern area to be processed on the processing surface of the workpiece 403 is exposed, and a pattern area without processing is covered by a photoresist layer 402. The workpiece 403 is a wafer made of silicon. The photoresist layer 402 is 10 μm in thickness.

Step b: The mask is affixed to a surface of the workpiece to be processed 403, opposite to the processing surface, where the processing pattern of interest on the mask has the same shape as and aligns with the pattern area to be processed on the processing surface. The mask includes a light shielding layer 404 and a base layer 405. The base layer 405 is made of stainless steel.

Step c: The mask affixed to the surface of the workpiece 403 is continuously cooled by flowing liquid nitrogen 406.

Step d: The cooled mask and the workpiece 403 are placed in a wet etching device, and an etchant 401 is added to the processing surface of the workpiece to be processed to start etching. Specifically, the etchant 401 is a TMAH etching solution.

Step e: An etching time is set. The mask and the workpiece to be processed 403 are then removed from the wet etching device. The etching is stopped. The mask and the workpiece to be processed 403 are separated to obtain a workpiece with a desirable etching structure. The desirable etching structure includes micro vias or grooves with a depth-to-width ratio of greater than 5.

In the prior art, the wet etching process generally can only process micro vias or grooves with depth-to-width ratios less than 4. For a structure with micro vias or grooves with depth-to-width ratios greater than 5 or even larger, different degrees of defects will be generated during the wet etching process. The method for synchronous wet etching processing of differential microstructures is specifically proposed for processing the structure with micro vias or grooves with a depth-to-width ratio greater than 5 or more, and has characteristics of high precision and high processing rate.

For a structure with micro vias or grooves with a depth-to-width ratio of greater than 5, the method of the present invention has an excellent processing effect over the conventional wet etching processing method. Firstly, the processing surface of the workpiece, i.e., the front surface, is photoengraved and developed to expose the material in the pattern area to be processed. At the same time, the mask with the same pattern is affixed on a surface opposite to the processing surface, i.e., the back surface of the workpiece to be processed. The mask is cooled by flowing liquid nitrogen.

Then, the workpiece to be processed is placed in a wet etching device together with the mask. Then the etchant is added to start etching. During the etching process, the mask is continuously cooled by liquid nitrogen. Therefore, the temperature of the local area of the workpiece to be processed which is in direct contact with the pattern on the mask is also lowered. The temperature of the other areas which are not in direct contact with the pattern on the mask is maintained at a higher state, that is, a high temperature area which is the same as the pattern area to be processed is formed on the workpiece to be processed. Therefore, on the workpiece to be processed, a temperature difference is formed between the pattern area to be processed and the retaining area. In the pattern area to be processed, the temperature is higher and the etching rate is faster; however, in the retaining area, the temperature is lower and the etching rate is slower. The difference in etching rate is created by creating a temperature difference on the workpiece, so that micro vias and grooves can be processed with a higher depth-to-width ratio.

Differences between various embodiments are described in the above embodiments of the present application. Various optimal features of the embodiments may be combined to form a preferred embodiment.

The embodiments are only illustrative of the present application, and are not intended to limit the application. It should be understood that for those of ordinary skills in the art, improvements or variations can be made based on the above descriptions, and such improvements and variations fall within the scope of the appended claims.

What is claimed is:

1. A method for synchronous wet etching processing of differential microstructures, comprising:

step a: performing photoetching on a processing surface of a workpiece to be processed to develop the processing surface of the workpiece; wherein a pattern area to be processed on the processing surface of the workpiece to be processed is exposed, and a pattern area without processing is covered by a photoresist layer;

step b: affixing a mask to a surface of the workpiece, opposite to the processing surface; wherein a processing pattern on the mask has the same shape as and aligns with the pattern area to be processed on the processing surface;

step c: continuously cooling the mask affixed to the surface of the workpiece;

step d: placing the cooled mask and the workpiece to be processed in a wet etching device; and adding an etchant to the processing surface of the workpiece to start etching;

step e: setting an etching time; then removing the mask and the workpiece from the wet etching device after the set etching time; stopping the etching; separating the mask and the workpiece to obtain a workpiece with a etching structure.

2. The method of claim 1, wherein in step a, the workpiece to be processed is a wafer made of silicon.

3. The method of claim 1, wherein in step a, the photoresist layer is 10 nm-10 μm in thickness.

4. The method of claim 1, wherein in step b, the mask comprises a light shielding layer and a base layer; the base layer is made of stainless steel or copper.

5. The method of claim 1, wherein in step c and/or step d, the mask is continuously cooled by flowing liquid nitrogen.

6. The method of claim 1, wherein in step d, the etchant is a TMAH etching solution or a KOH etching solution.

7. The method of claim 1, wherein in step e, the etching time is set as 5 min to 5 h.

8. The method of claim 1, wherein in step e, a depth-to-width ratio of micro vias or grooves in the etching structure is greater than 5.

* * * * *